(12) United States Patent
Honboh

(10) Patent No.: US 7,244,922 B2
(45) Date of Patent: Jul. 17, 2007

(54) SEMICONDUCTOR DEVICE AND ELECTRONIC APPARATUS

(75) Inventor: Masahiro Honboh, Kashiba (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 223 days.

(21) Appl. No.: 11/142,400

(22) Filed: Jun. 2, 2005

(65) Prior Publication Data
US 2005/0270404 A1 Dec. 8, 2005

(30) Foreign Application Priority Data
Jun. 4, 2004 (JP) .......................... P2004-167371

(51) Int. Cl.
*H01L 31/00* (2006.01)
*H04N 5/00* (2006.01)

(52) U.S. Cl. .................. 250/214 R; 250/239; 257/432; 257/433

(58) Field of Classification Search ............ 250/208 R, 250/239; 348/431–433
See application file for complete search history.

(56) References Cited

U.S. PATENT DOCUMENTS

| 6,512,255 B2 * | 1/2003 | Aoki et al. ................. 257/254 |
| 6,855,886 B2 * | 2/2005 | Kawamura et al. ......... 174/357 |
| 7,009,267 B2 * | 3/2006 | Honboh ....................... 257/433 |
| 7,019,375 B2 * | 3/2006 | Harazono .................... 257/433 |
| 7,138,664 B2 * | 11/2006 | Okazaki et al. ............. 257/432 |
| 2005/0094397 A1 * | 5/2005 | Yamada et al. ............. 362/253 |
| 2006/0060882 A1 * | 3/2006 | Ohe et al. .................... 257/100 |

FOREIGN PATENT DOCUMENTS

JP  09-084162 A  3/1997

\* cited by examiner

*Primary Examiner*—John R. Lee
(74) *Attorney, Agent, or Firm*—Birch, Stewart, Kolasch & Birch, LLP

(57) ABSTRACT

The semiconductor device has a lead frame, a photo-detection chip and a control IC chip mounted on the lead frame, a first sealing portion that seals the photo-detection chip and the control IC chip, and a second sealing portion that covers the first sealing portion in a state of partially exposing the lens portion. The second sealing portion has a raised portion formed along the lens portion on the basal end side of the lens portion, which makes it possible to obtain a sufficient shielding effect against noise and therefore to improve tolerance to noise.

9 Claims, 10 Drawing Sheets

SEMICONDUCTOR DEVICE AND ELECTRONIC APPARATUS

CROSS-REFERENCE TO RELATED APPLICATIONS

This nonprovisional application claims priority under 35 U.S.C. §119(a) on Patent Application No. 2004-167371 filed in Japan on 4 Jun. 2004, the entire contents of which are incorporated herein by reference.

BACKGROUND OF THE INVENTION

The present invention relates to a semiconductor device that has a photo-detection element and a signal processing section, and in particular to a semiconductor device for optical communications, which is installed in an electronic apparatus of, for example, a TV (television set), a VTR (video tape recorder), an audio component or an air conditioner, and which generates a control signal for controlling the operation of each electronic apparatus by receiving an infrared ray signal from a transmitter. The present invention relates also to the electronic apparatus provided with the above-stated semiconductor device.

As shown in the front view of FIG. 8A, the side view of FIG. 8B and the side sectional view of FIG. 8C, a conventional semiconductor device for optical communications has a lead frame 101, a photo-detection chip 102 and a control IC chip 103 mounted on the lead frame 101, a first sealing portion 110 made of an infrared transmitting resin, which portion 110 seals the photo-detection chip 102 and the control IC chip 103 and has a lens portion 111, and a second sealing portion 120 made of a conductive resin, which portion 120 covers the first sealing portion 110 except for the lens portion 111 (refer to JP H09-84162 A)

The conventional semiconductor device for optical communications receives control signals transmitted from the transmitter by infrared rays to control a variety of electronic apparatuses. Since the signals transmitted by infrared rays are very feeble, a high-gain amplifier is built into the semiconductor device for optical communications. The optical signals of the infrared rays are amplified by this amplifier, and thereafter the optical signal is converted into a digital signal to be output. Thus, the semiconductor device for optical communications is very sensitive to noise.

Accordingly, as an anti-noise measure in the conventional semiconductor device for optical communications, noise is removed by covering the first sealing portion 110 with the second sealing portion 120 except for the lens portion 111 corresponding to the photo-detection region and by electrically connecting the second sealing portion 120 to a GND terminal of the lead frame 101.

However, there are a wide variety of conventional electronic apparatuses equipped with the semiconductor devices for optical communications. The above-sated anti-noise measure in the conventional semiconductor device for optical communications has disadvantageously been insufficient, particularly when the conventional semiconductor device for optical communications is installed in an electronic apparatus (TV or the like) having intense electromagnetic noise.

SUMMARY OF THE INVENTION

An object of the present invention is to provide a high-quality semiconductor device whose tolerance to noise is improved.

In order to achieve the above-mentioned object, the present invention provides a semiconductor device comprising:
a lead frame;
a photo-detection element mounted on the lead frame;
a signal processing section mounted on the lead frame and electrically connected to the photo-detection element;
a first sealing portion made of a translucent resin, sealing the photo-detection element and the signal processing section, and having a lens portion; and
a second sealing portion made of a conductive resin and covering the first sealing portion in a state of partially exposing the lens portion of the first sealing portion, the second sealing portion having a raised portion formed along the lens portion on a basal end side of the lens portion.

According to the semiconductor device of the present invention, the second sealing portion has a raised portion formed along the lens portion on the basal end side of the lens portion. Therefore, it is possible to obtain a sufficient shielding effect against noise of electromagnetic waves and so on, and to improve the tolerance to noise.

Thus, even under the noisy environment, a reduction in the reception efficiency (reception distance characteristic) can be suppressed to a minimum without largely reducing the distance between the transmitter and the semiconductor device that can receive the signal light (infrared light or the like) from the transmitter in comparison with the case where no noise exists.

In the case where the signal light received by the photo-detection element is infrared light as an example, the translucent resin is made of an infrared transmitting resin.

In the semiconductor device of one embodiment of the present invention, the raised portion is formed into an annular shape peripherally on the basal end side of the lens portion.

According to the semiconductor device of this embodiment, the anti-noise characteristic of the semiconductor device is further improved.

In the semiconductor device according to one embodiment of the present invention, the raised portion is divided into a plurality of portions in the circumferential direction of the lens portion.

In the semiconductor device of one embodiment of the present invention, the raised portion has a length of approximately 0.5 mm in an optical axis direction of the lens portion.

According to the semiconductor device of the one embodiment, the length of the raised portion is approximately 0.5 mm. Therefore, it is possible to minimize deterioration in the directivity angle characteristic while improvement of the noise immunity is maintained. Herein, the directivity angle characteristic is such a characteristic that a coverage distance from the transmitter reduces as the angle of the signal light increases with respect to the optical axis of the lens portion, where the angle of the signal light is taken as 0° for the optical axis of the lens portion.

In the semiconductor device of one embodiment of the present invention, the second sealing portion has a plurality of belt portions that extend along the lens portion from the raised portion to a fore end portion of the lens portion.

According to the semiconductor device of the one embodiment, since the second sealing portion has a plurality of belt portions, a mesh portion is formed by using these belt portions. Covering the lens portion with the mesh portion allows the noise immunity to be further improved.

In the semiconductor device of one embodiment of the present invention, both side surfaces of each of the belt portions are formed in a tapered shape so that an interval between both the side surfaces of each of the belt portions becomes narrower as located apart from a surface of the lens portion.

According to the semiconductor device of the one embodiment, since both side surfaces of each of the belt portions are formed into a tapered shape, any break or cut of the belt portions is prevented when the portions are released from the metal mold. Thus, the quality of belt portions is improved, allowing the semiconductor device to be produced with stability.

In the semiconductor device of one embodiment of the present invention, each of the belt portions has a corner formed into a round shape.

According to the semiconductor device of the one embodiment, since the corners of the belt portions are formed into a round shape, any break or cut of the belt portions is prevented when the belt portions are released from the metal mold. Thus, the quality of the belt portions is improved, allowing the semiconductor device to be produced with stability.

In the semiconductor device of one embodiment of the present invention, the belt portions have a thickness of not greater than approximately 0.4 mm in a direction perpendicular to the surface of the lens portion.

According to the semiconductor device of the one embodiment, since the thickness of the belt portion is not greater than approximately 0.4 mm, shielding of the signal light from the transmitter is prevented. Thereby, reduction in the reception distance characteristic (the directivity angle characteristic in particular) is suppressed to a minimum, which allows the characteristic to be stably obtained.

In the semiconductor device of one embodiment of the present invention, a thickness of each of the belt portions in a direction perpendicular to the surface of the lens portion becomes smaller as located closer to the fore end portion of the lens portion.

According to the semiconductor device of the one embodiment, since the thickness of the belt portions becomes reduced as located closer to the fore end side of the lens portion, the reduction in the reception distance characteristic is suppressed to a minimum, which allows the characteristic to be stably obtained.

In the semiconductor device of one embodiment of the present invention, a gap is provided between the lens portion and the raised portion.

According to the semiconductor device of the one embodiment, the gap is provided between the lens portion and the raised portion. Therefore, the photo-detectable region of the lens portion is increased, and the incidence of diffused reflection light and so on of the signal light from the transmitter is also increased in addition to the signal light directly incident from the transmitter. Therefore, the quantity of reception light is totally increased, allowing the reception distance characteristic to be improved.

The present invention also provides an electronic apparatus comprises the above-stated semiconductor device.

According to the electronic apparatus of the present invention, the electronic apparatus is provided with the semiconductor device of the present invention. Therefore, it is possible to obtain the noise-tolerance electronic apparatus having a sufficient shielding effect against noise.

As described above, in the semiconductor device of the present invention, the second sealing portion has the raised portion formed along the lens portion on the basal end side of the lens portion. Therefore, a sufficient shielding effect against noise is obtained, and the tolerance to noise can be improved.

The electronic apparatus of the present invention is an electronic apparatus tolerant to noise since the electronic apparatus is provided with the semiconductor device of the present invention.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The Present invention will be described in detailed below based on embodiments thereof.

FIRST EMBODIMENT

Figure 1A:
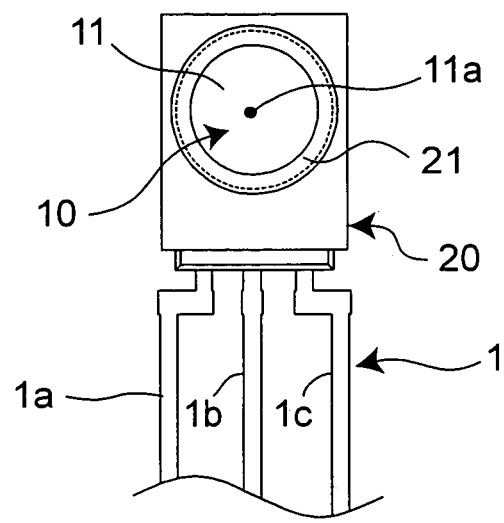
FIG. 1A is a front view showing a semiconductor device according to a first embodiment of the present invention.
Figure 1B:
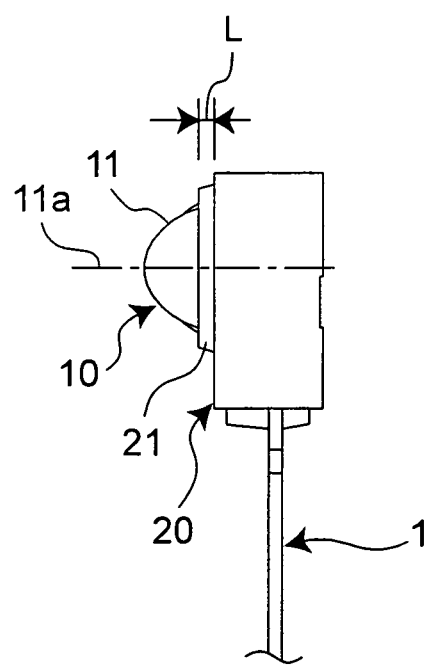
FIG. 1B is a side view showing the semiconductor device according to the first embodiment of the present invention.
Figure 1C:
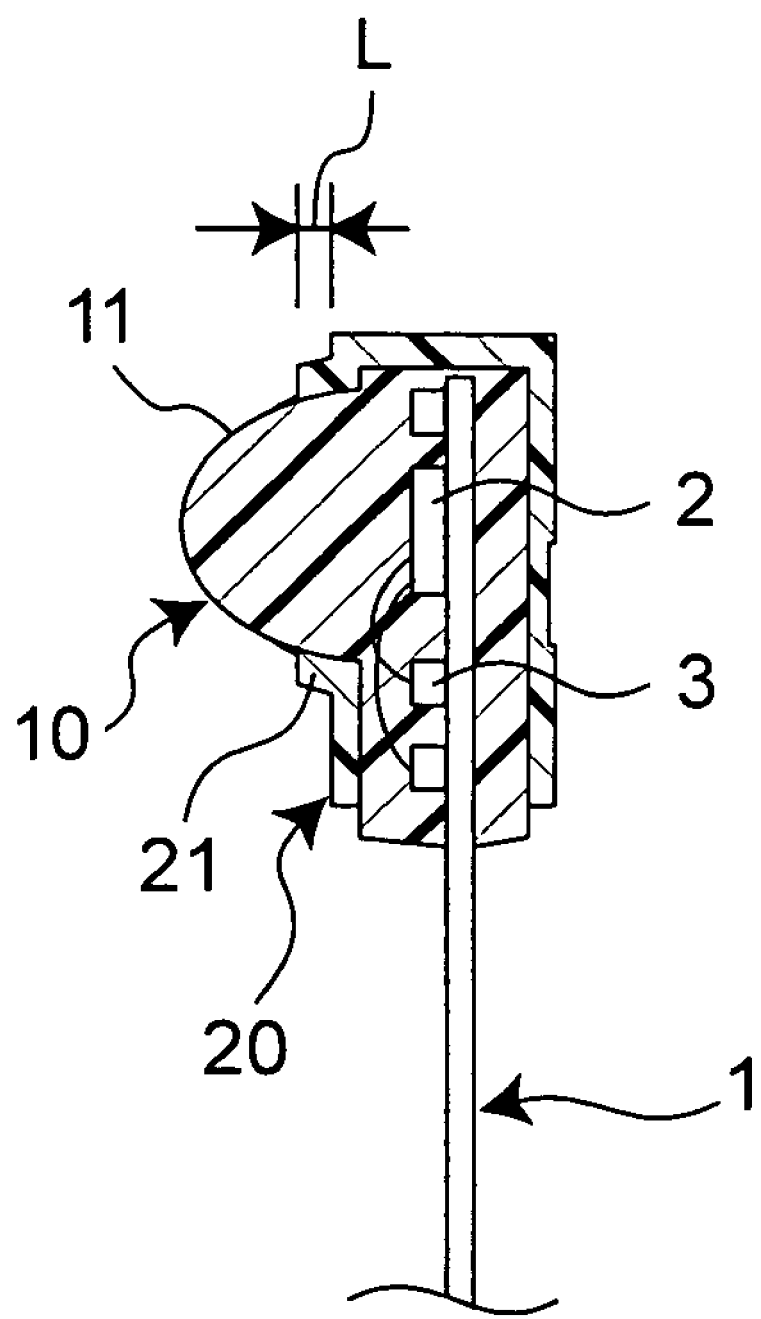
FIG. 1C is a side sectional view showing the semiconductor device according to the first embodiment of the present invention.

FIGS. 1A, 1B and 1C show structural views of a semiconductor device according to one embodiment of the present invention. FIG. 1A shows a front view, FIG. 1B shows a side view, and FIG. 1C shows a side sectional view of the semiconductor device. The semiconductor device includes a lead frame 1, a photo-detection chip 2 (one example of the photo-detection element) mounted on the lead frame 1, a control IC chip 3 (one example of the signal processing section) mounted on the lead frame 1 and electrically connected to the photo-detection chip 2, a first sealing portion 10 made of a translucent resin, sealing the photo-detection chip 2 and the control IC chip 3 and having a lens portion 11, and a second sealing portion 20 made of a conductive resin and covering the first sealing portion 10 under a state in which the lens portion 11 is partially exposed.

The lead frame 1 has a first lead 1a for signal, a second lead 1b for power supply and a third lead 1c for connection to the ground. The photo-detection chip 2 is constructed of, for example, a photodiode, a phototransistor or the like. The control IC chip 3 has a high-gain built-in amplifier.

The photo-detection chip 2 and the control IC chip 3 are connected together via a conductive wire. The photo-detection chip 3 is connected to the third lead 1c via a conductive wire. Moreover, the control IC chip 3 is connected to the first lead 1a, the second lead 1b and the third lead 1c via respective conductive wires.

The first sealing portion 10 is made of a translucent resin such as an infrared transmitting resin so as to integrally fix the lead frame 1, the photo-detection chip 2 and the control IC chip 3. The lens portion 11 of the first sealing portion 10 has a convex curved surface, which corresponds to a photo-detection region of the semiconductor device, so as to guide a signal light of infrared light or the like to the light-receiving surface of the photo-detection chip 2.

The second sealing portion 20 has a raised portion 21 formed along the lens portion 11 on the basal end side of the lens portion 11. The raised portion 21 is formed into an annular shape peripherally on the basal end side of the lens portion 11.

In the semiconductor device of the above construction, when the signal light is incident on the convex curved surface of the lens portion 11, the signal light is guided to the light-receiving surface of the photo-detection chip 2. Then, the photo-detection chip 2 converts the signal light into an electrical signal and outputs the electrical signal to the control IC chip 3. Then, the control IC chip 3 executes prescribed signal processing of the electrical signal so as to output an output signal thereof to the first the lead 1a.

The control IC chip 3 is connected to a power source of a board (not shown) through the second lead 1b, and an electric power is supplied from the power source. The control IC chip 3 is connected to the GND (ground) terminal of the board via the third lead 1c.

The second sealing portion 20 is connected to the third lead 1c. Therefore, when the semiconductor device is mounted on the board so as to connect the third lead 1c with the GND terminal, the second sealing portion 20 plays the role of an electromagnetic wave shield for the photo-detection chip 2 and the control IC chip 3 which are sealed in the first sealing portion 10.

According to the semiconductor device of the above construction, the second sealing portion 20 has the raised portion 21 formed along the lens portion 11 on the basal end side of the lens portion 11. Therefore, a sufficient shielding effect against noise of electromagnetic waves or the like is obtained, and the tolerance to noise can be improved.

Thus, when the semiconductor device having the above construction is installed particularly in an electronic apparatus (such as a television) where the electromagnetic noise is intense, it is possible to suppress a reduction in the reception efficiency (reception distance characteristic) to a minimum, that is, without large reduction of the distance over which the signal light can be received from the transmitter in comparison with the case where no noise exists.

Figure 2:
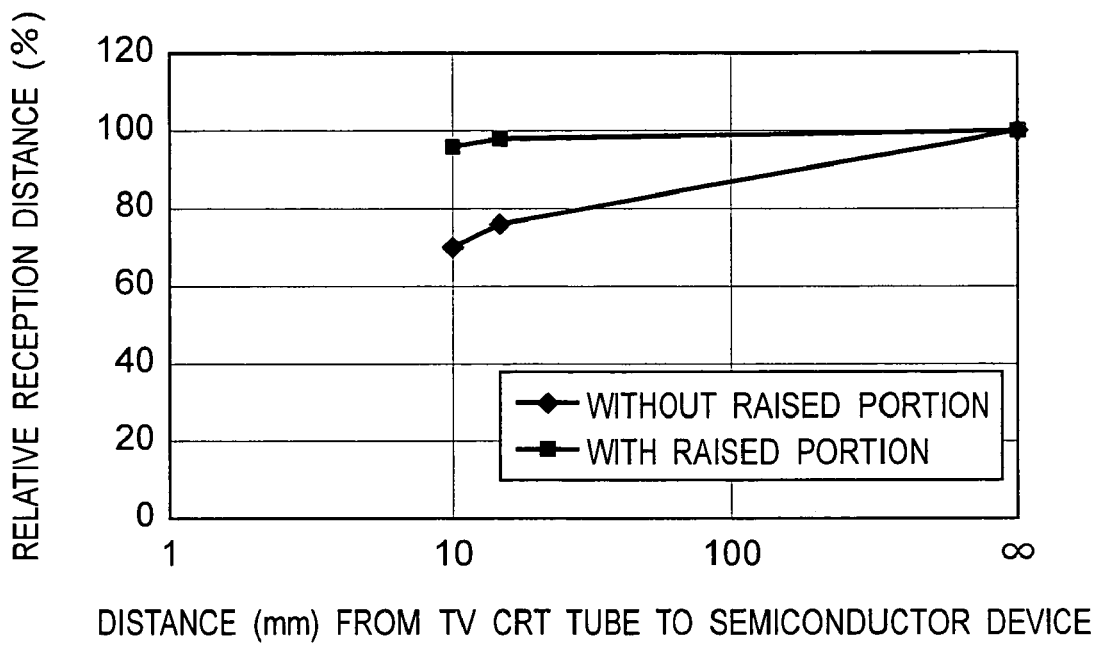
FIG. 2 is a graph showing a relation between a distance from a TV cathode ray tube to the semiconductor device and a relative reception distance.

Next, FIG. 2 shows a graph indicating an examined result on the influence of the reception distance of the semiconductor device under the influence of electromagnetic noise. The horizontal axis represents a distance (mm) from a TV cathode ray tube (noise emission source) to the semiconductor device. The vertical axis represents a relative reception distance (%). In this case, the relative reception distance is represented in relative comparison where the distance between the transmitter and the semiconductor device that can receive a signal light from the transmitter is 100%, which is under the condition that the distance from the TV cathode ray tube to the semiconductor device is infinite (specifically, 1000 mm).

As shown in FIG. 2, the relative reception distance is reduced as the distance from the TV cathode ray tube to the semiconductor device becomes reduced. Thereby, it can be understood that the electromagnetic noise intensely influences the semiconductor device. Also, it can be understood that the reception distance is increased, that is, the tolerance to noise is improved, when the semiconductor device has the raised portion than when the semiconductor device has no raised portion.

In the present invention, as described above, the noise immunity is improved by providing the raised portion 21 along the lens portion 11 that is the photo-detection region.

Next, as shown in FIGS. 1B and 1C, the length L of the raised portion 21 in the direction of the optical axis 11a of the lens portion 11 should preferably be approximately 0.5 mm, so that the deterioration in the directivity angle characteristic can be minimized while improving the noise immunity. In this case, the directivity angle characteristic means such a characteristic that a coverage distance from the transmitter reduces as the angle of the signal light with respect to the optical axis 11a of the lens portion 11 increases, where the angle of the signal light is taken as 0° for the optical axis 11a of the lens portion 11.

Figure 3:
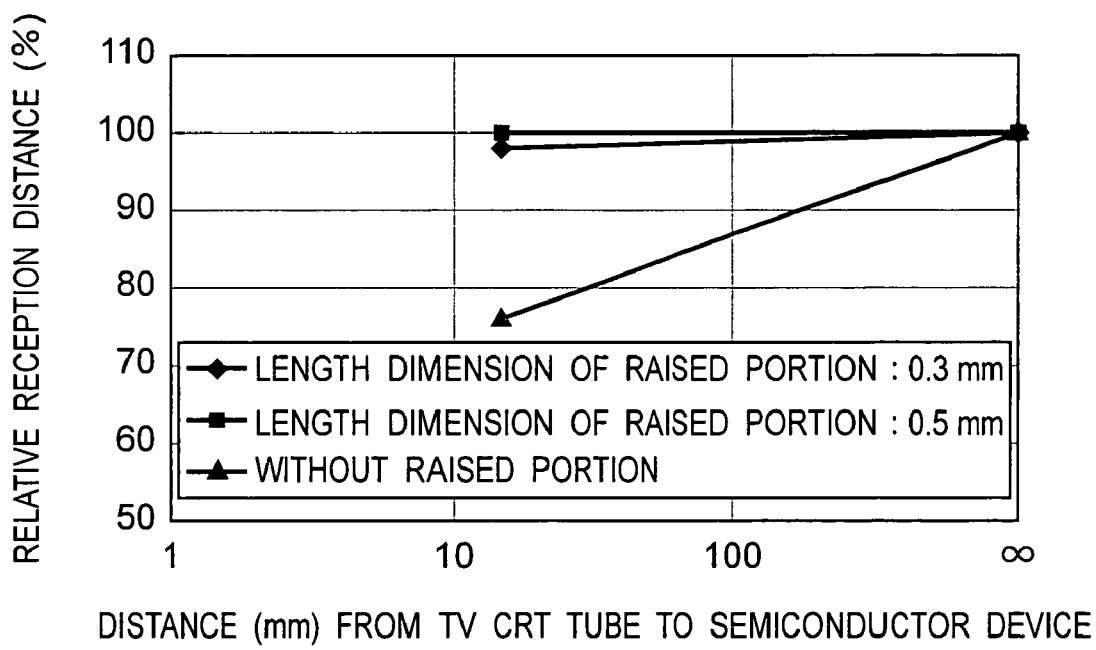
FIG. 3 is a graph showing a relation between the distance from the TV cathode ray tube to the semiconductor device and the relative reception distance.

FIG. 3 shows a graph indicating an examined result on the influence of the reception distance of the semiconductor device under the influence of electromagnetic noise. The horizontal axis represents a distance (mm) from a TV cathode ray tube (noise emission source) to the semiconductor device. The vertical axis represents a relative reception distance (%). In this case, the relative reception distance is represented in relative comparison where the distance between the transmitter and the semiconductor device that can receive a signal light from the transmitter is 100%, which is under the condition that the distance from the TV cathode ray tube to the semiconductor device is infinite (specifically, 1000 mm).

Figure 4:
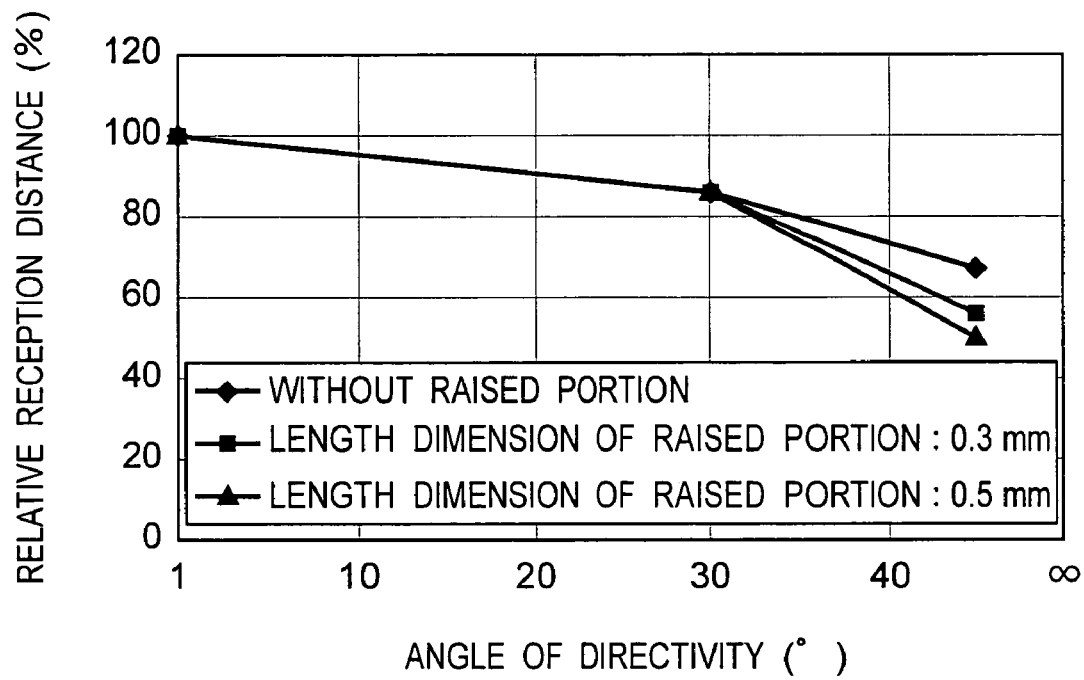
FIG. 4 is a graph showing a relation between an angle of directivity and the relative reception distance.

FIG. 4 shows a graph indicating an examined result on the relation between the angle of directivity of the signal light from the transmitter to the semiconductor device and the reception distance of the semiconductor device. The horizontal axis represents the angle (°) of directivity. The vertical axis represents the relative reception distance (%). In this case, the angle of directivity is defined as the angle of the signal light with respect to the optical axis 11a of the lens portion 11, where the angle of directivity is taken as 0° for the optical axis 11a of the lens portion 11. Moreover, the relative reception distance is represented in relative comparison where the distance between the transmitter and the semiconductor device that can receive a signal light from the transmitter is 100% at the time when the angle of directivity is 0°.

As shown in FIG. 3, the relative reception distance is reduced as the distance from the TV cathode ray tube to the semiconductor device becomes reduced. Thereby, it can be understood that the electromagnetic noise intensely influences the semiconductor device. Moreover, it can be understood that the reception distance is increased when the semiconductor device has the raised portion than when the semiconductor device has no raised portion, meaning that the tolerance to noise is improved. Moreover, it can be understood that the relative reception distance is greater when the length of the raised portion is 0.5 mm than when the length of the raised portion is 0.3 mm.

As shown in FIG. 4, it can be understood that the relative reception distance is reduced as the angle of directivity large is greater. Also, it can be understood that the relative reception distance is improved when the semiconductor device has the raised portion than when the semiconductor device has no raised portion. Moreover, it can be understood that the relative reception distance is improved when the length of the raised portion is 0.3 mm than when the length of the raised portion is 0.5 mm.

Therefore, as shown in FIGS. 3 and 4, it can be understood that, when the semiconductor device has the raised portion, the reception distance is increased and thereby the tolerance to noise is improved, whereas the directivity angle characteristic is deteriorated. Moreover, the length of the raised portion needs to be not greater than 0.5 mm when half of a light quantity on the straight line (i.e. a light quantity at the directivity angle 0°) is secured at an angle of directivity of 45°.

As described above, according to the present invention, the raised portion 21 is provided along the lens portion 11 that is the photo-detection region, and thereby the noise immunity is improved. Also, the length L of the raised portion 21 is set to 0.5 mm in order to minimize the deterioration in the directivity angle characteristic.

SECOND EMBODIMENT

Figure 5A:
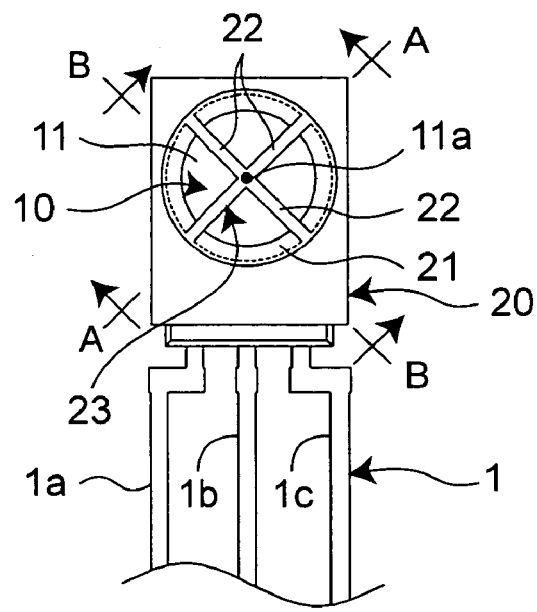
FIG. 5A is a front view showing a semiconductor device according to a second embodiment of the present invention.
Figure 5B:
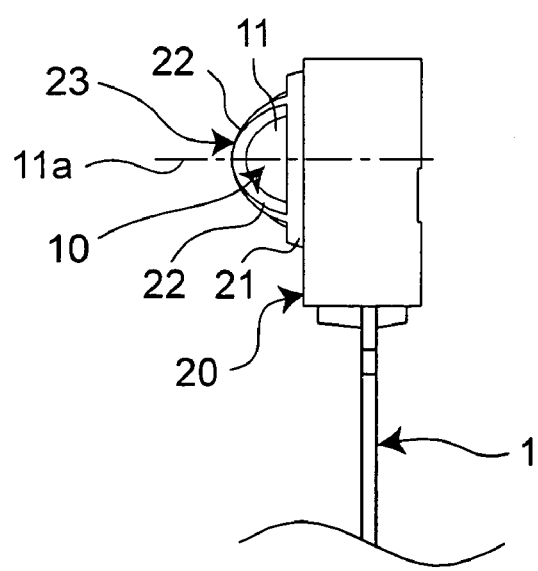
FIG. 5B is a side view showing the semiconductor device according to the second embodiment of the present invention.
Figure 5C:
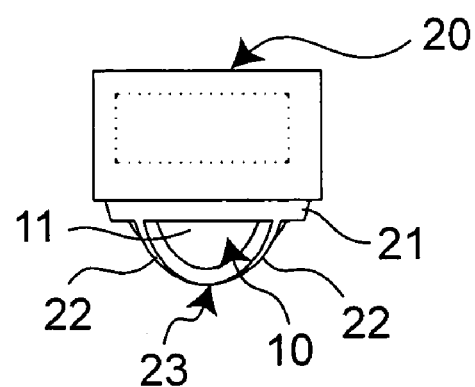
FIG. 5C is a plan view showing the semiconductor device according to the second embodiment of the present invention.
Figure 5D:
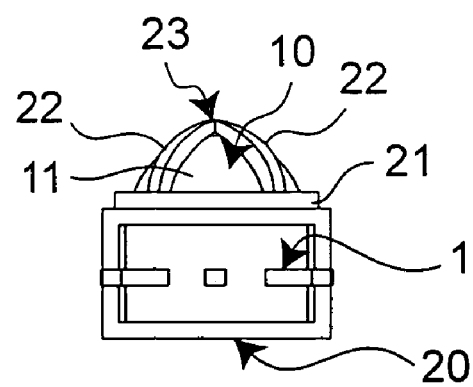
FIG. 5D is a bottom view showing the semiconductor device according to the second embodiment of the present invention.

FIGS. 5A, 5B, 5C and 5D show another embodiment of the present invention. FIG. 5A shows a front view, FIG. 5B shows a side view, FIG. 5C shows a plan view, and FIG. 5D shows a bottom view of the semiconductor device. In the second embodiment, the same portions as those of the first embodiment are denoted by the same reference numerals, and no detailed description is provided therefor.

That is, in the semiconductor device of the second embodiment, the second sealing portion 20 has a plurality of (four in the present embodiment) belt portions 22. The belt portions 22 extend along the lens portion 11 from the raised portion 21 to the fore end (apex) of the lens portion 11.

In this way, a mesh portion 23 is formed by the plurality of belt portions 22. The noise immunity can be further improved by covering the lens portion 11 with the mesh portion 23.

Figure 6:
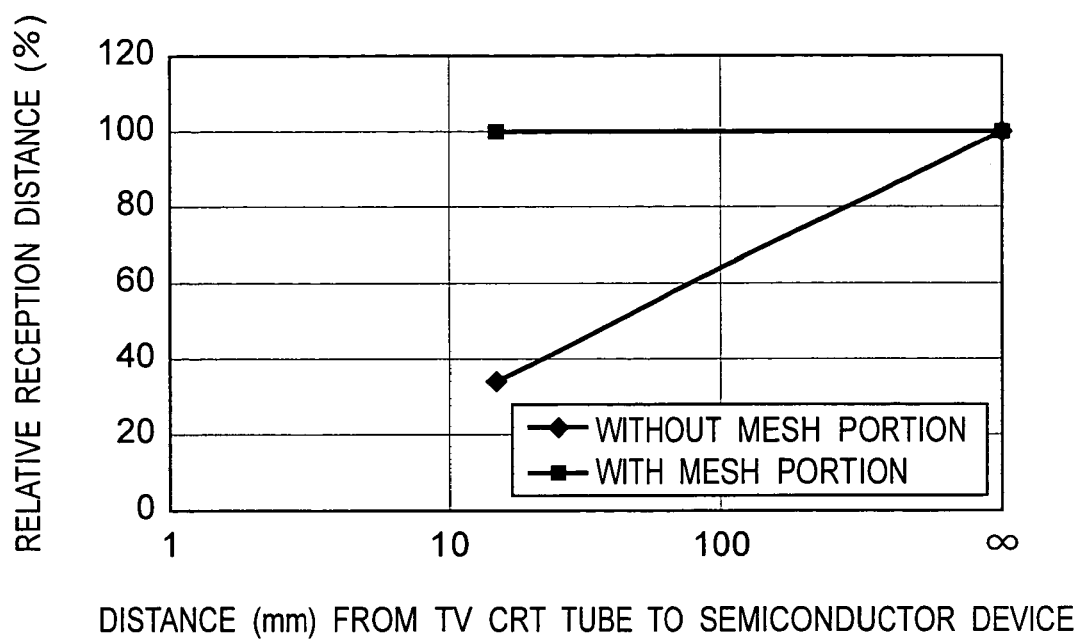
FIG. 6 is a graph showing a relation between the distance from the TV cathode ray tube to the semiconductor device and the relative reception distance.

FIG. 6 shows a graph indicating an examined result on the influence of the reception distance of the semiconductor device under the influence of electromagnetic noise. The horizontal axis represents the distance (mm) from the TV cathode ray tube (noise emission source) to the semiconductor device. The vertical axis represents the relative reception distance (%). In this case, the relative reception distance is represented in relative comparison where the distance between the transmitter and the semiconductor device that can receive a signal light from the transmitter is 100%, which is under the condition that the distance from the TV cathode ray tube to the semiconductor device is infinite (specifically, 1000 mm).

As shown in FIG. 6, the relative reception distance is reduced as the distance from the TV cathode ray tube to the semiconductor device becomes reduced. Thereby, it can be understood that the electromagnetic noise intensely influences the semiconductor device. Moreover, it can be understood that the reception distance is increased when the semiconductor device has the raised portion than when the semiconductor device has no raised portion, meaning that the tolerance to noise is improved.

In the present invention, as described above, the noise immunity is improved by covering the lens portion 11, which is the photo-detection region, with the mesh portion 23.

Figure 7A:
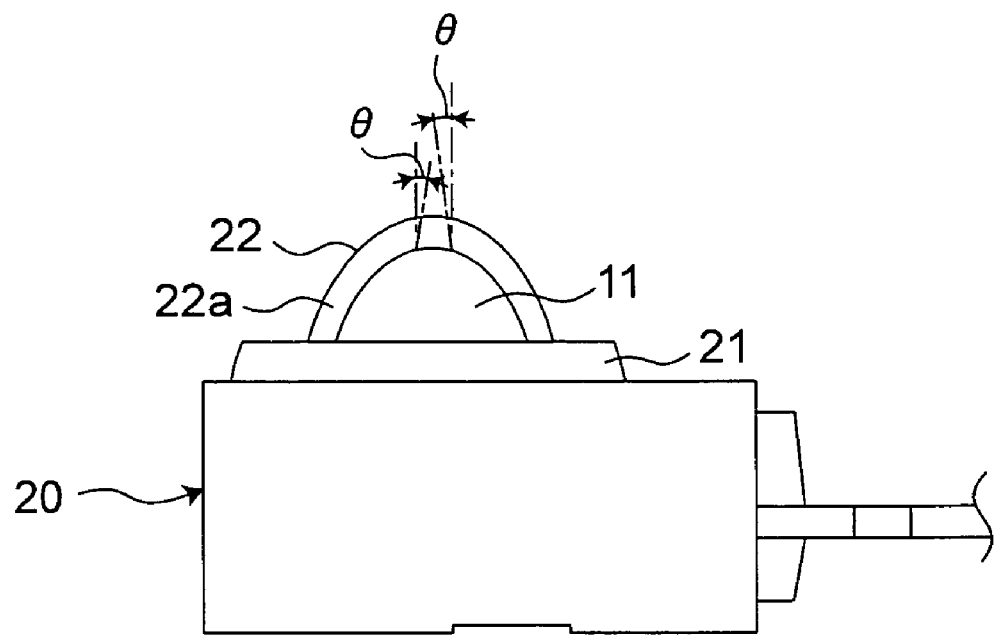
FIG. 7A is a view of the arrow line A—A of FIG. 5A.
Figure 7B:
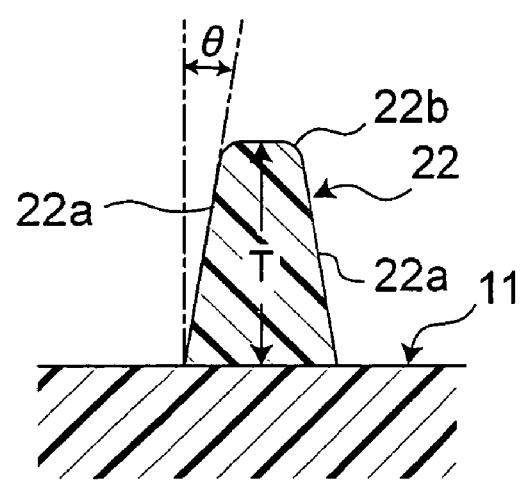
FIG. 7B is a sectional view taken along the line B—B of FIG. 5A.
Figure 8A:
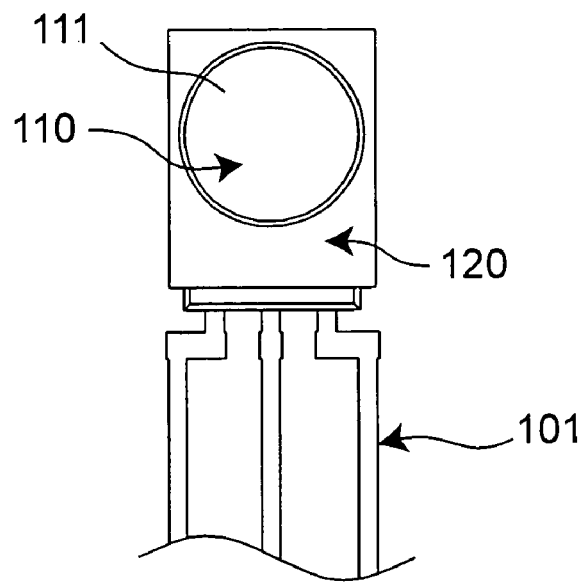
FIG. 8A is a front view showing a conventional semiconductor device.
Figure 8B:
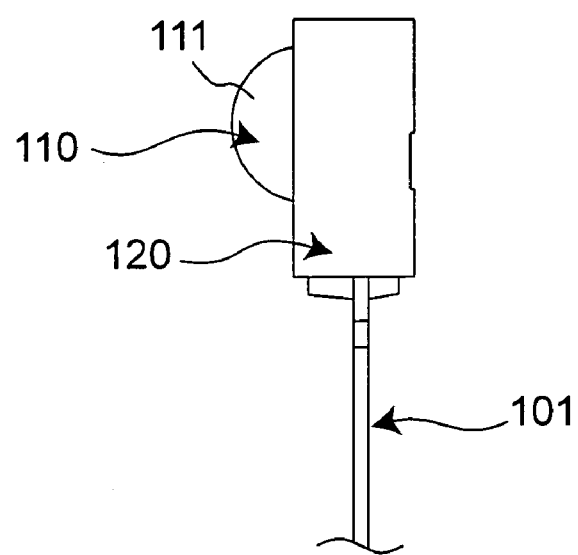
FIG. 8B is a side view showing the conventional semiconductor device.
Figure 8C:
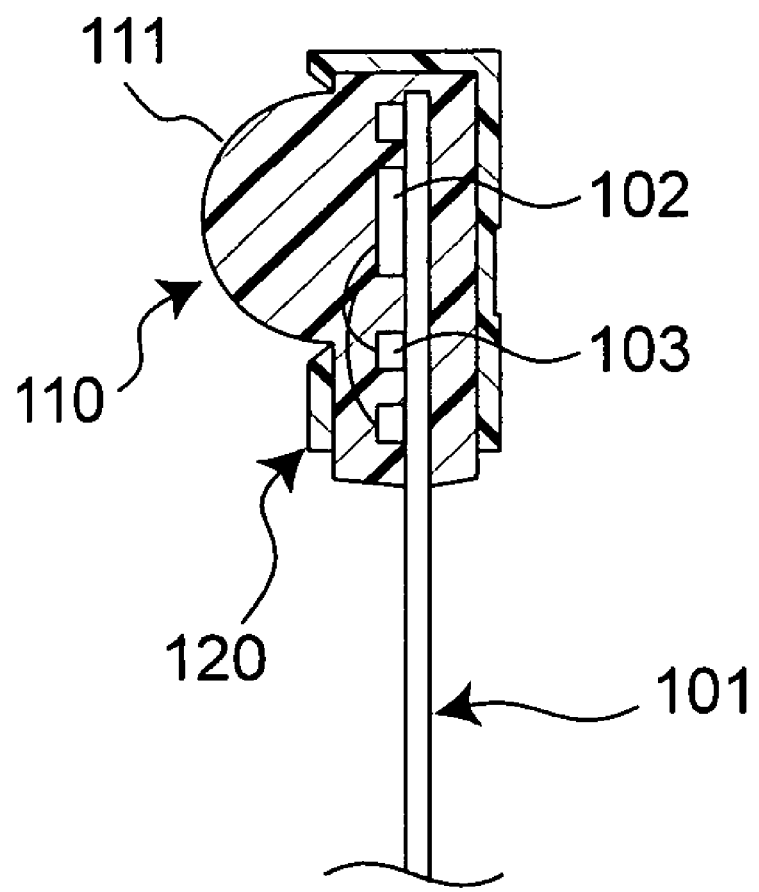
FIG. 8C is a side sectional view showing the conventional semiconductor device.

Next, as shown in FIGS. 7A and 7B, a side surface 22a of the belt portion 22 is formed in a tapered shape. Therefore, the interval between both side surfaces 22a and 22a of the belt portions 22 is reduced with distance from the surface of the lens portion 11. An angle θ of inclination between both side surfaces 22a and 22a of the belt portion 22 is 3°, for example. FIG. 7A is a view taken along the arrow line A—A of FIG. 5A. FIG. 7B is a sectional view taken along the line B—B of FIG. 5A.

As described above, since the side surfaces 22a of the belt portions 22 are formed in a tapered shape, the belt portions 22 is prevented from any break or cut when the semiconductor device is released from a metal mold thereof. Thereby, the semiconductor device is improved in quality, allowing it to be produced with stability.

Moreover, a corner portion 22b of the belt portion 22 is formed into a round shape. Therefore, the belt portions 22 is prevented form any break or cut when the semiconductor device is released from a metal mold thereof. Thereby, the semiconductor device is improved in quality, allowing it to be produced with stability.

Thickness T of the belt portion 22 in a direction perpendicular to the surface of the lens portion 11 should preferably be not greater than approximately 0.4 mm. This prevents from shielding of the signal light from the transmitter, and therefore, from suppressing the reduction in the reception distance characteristic (the directivity angle characteristic in particular) to a minimum, which allows the characteristic to be stably obtained.

Moreover, the thickness T of the belt portion 22 in the direction perpendicular to the surface of the lens portion 11 should preferably become reduced as located closer to the fore end of the lens portion 11. The reduction in the reception distance characteristic is suppressed to a minimum, which allows the characteristic to be stably obtained.

Moreover, a gap should preferably be provided between the lens portion 11 and the raised portion 21. The gap causes the photo-detectable region of the lens portion 11 to be increased. Thereby, diffused reflection lights of the signal light from the transmitter are also entered in addition to the signal light directly incident from the transmitter. Therefore, the quantity of reception light is totally increased, which allows the reception distance characteristic to be improved.

THIRD EMBODIMENT

The unshown electronic apparatus of the embodiment is provided with the semiconductor device of the first or second embodiment. According to the electronic apparatus of the present embodiment, since the electronic apparatus is provided with the semiconductor device of the invention, it is possible for the electronic apparatus to have a sufficient shielding effect against noise, which makes the electronic apparatus resistant to noise. For example, a television set, a video tape recorder, an audio component, an air conditioner and the like can be enumerated as the electronic apparatus, which are remotely controlled by using infrared light as the signal light.

It should be noted that the present invention is not limited to the above embodiments. For example, the raised portion may be divided into a plurality of portions in the circumferential direction of the lens portion.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor device comprising:
   a lead frame;
   a photo-detection element mounted on the lead frame;
   a signal processing section mounted on the lead frame and electrically connected to the photo-detection element;
   a first sealing portion made of a translucent resin, sealing the photo-detection element and the signal processing section, and having a lens portion; and
   a second sealing portion made of a conductive resin and covering the first sealing portion in a state of partially exposing the lens portion of the first sealing portion, the second sealing portion having a raised portion formed along the lens portion on a basal end side of the lens portion.

2. The semiconductor device as claimed in claim 1, wherein
   the raised portion has a length of approximately 0.5 mm in an optical axis direction of the lens portion.

3. The semiconductor device as claimed in claim 1, wherein
   the second sealing portion has a plurality of belt portions that extend along the lens portion from the raised portion to a fore end portion of the lens portion.

4. The semiconductor device as claimed in claim 3, wherein
   both side surfaces of each of the belt portions are formed in a tapered shape so that an interval between both the side surfaces of each of the belt portions becomes narrower as located apart from a surface of the lens portion.

5. The semiconductor device as claimed in claim 3, wherein
   each of the belt portions has a corner formed into a round shape.

6. The semiconductor device as claimed in claim 3, wherein
   the belt portions have a thickness of not greater than approximately 0.4 mm in a direction perpendicular to the surface of the lens portion.

7. The semiconductor device as claimed in claim 3, wherein
   a thickness of each of the belt portions in a direction perpendicular to the surface of the lens portion becomes smaller as located closer to the fore end portion of the lens portion.

8. The semiconductor device as claimed in claim 1, wherein
   a gap is provided between the lens portion and the raised portion.

9. An electronic apparatus comprising the semiconductor device of claim 1.

* * * * *